United States Patent
Dias et al.

(10) Patent No.: US 9,786,517 B2
(45) Date of Patent: Oct. 10, 2017

(54) ABLATION METHOD AND RECIPE FOR WAFER LEVEL UNDERFILL MATERIAL PATTERNING AND REMOVAL

(71) Applicants: Rajendra C. Dias, Phoenix, AZ (US); Lars D. Skoglund, Chandler, AZ (US); Anil R. Indluru, Tempe, AZ (US); Edward R. Prack, Phoenix, AZ (US); Danish Faruqui, Chandler, AZ (US); Tyler N. Osborn, Gilbert, AZ (US); Amram Eitan, Scottsdale, AZ (US); Timothy A. Gosselin, Phoenix, AZ (US)

(72) Inventors: Rajendra C. Dias, Phoenix, AZ (US); Lars D. Skoglund, Chandler, AZ (US); Anil R. Indluru, Tempe, AZ (US); Edward R. Prack, Phoenix, AZ (US); Danish Faruqui, Chandler, AZ (US); Tyler N. Osborn, Gilbert, AZ (US); Amram Eitan, Scottsdale, AZ (US); Timothy A. Gosselin, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 11 days.

(21) Appl. No.: 14/021,938

(22) Filed: Sep. 9, 2013

(65) Prior Publication Data

US 2015/0072479 A1    Mar. 12, 2015

(51) Int. Cl.
*H01L 21/56* (2006.01)
*H01L 23/00* (2006.01)
(Continued)

(52) U.S. Cl.
CPC ............ *H01L 21/56* (2013.01); *H01L 21/563* (2013.01); *H01L 24/11* (2013.01);
(Continued)

(58) Field of Classification Search
CPC ........... H01L 21/563; H01L 2224/1112; H01L 2224/1148; H01L 2021/60022
See application file for complete search history.

(56) References Cited

U.S. PATENT DOCUMENTS 5,834,162 A * 11/1998 Malba .......................... 430/317
6,228,678 B1 * 5/2001 Gilleo ................... H01L 21/563
228/180.21
(Continued)

*Primary Examiner* — Mary Wilczewski
(74) *Attorney, Agent, or Firm* — Schwabe, Williamson & Wyatt P.C.

(57) ABSTRACT

Introducing an underfill material over contact pads on a surface of an integrated circuit substrate; and ablating the introduced underfill material to expose an area of the contact pads using temporally coherent electromagnetic radiation. A method including first ablating an underfill material to expose an area of contact pads on a substrate using temporally coherent electromagnetic radiation; introducing a solder to the exposed area of the contact pads; and second ablating the underfill material using temporally coherent electromagnetic radiation. A method including introducing an underfill material over contact pads on a surface of an integrated circuit substrate; defining an opening in the underfill material to expose an area of the contact pads using temporally coherent electromagnetic radiation; introducing a solder material to the exposed area of the contact pads; and after introducing the solder, removing the sacrificial material.

13 Claims, 3 Drawing Sheets

(51) Int. Cl.
  *H01L 21/48* (2006.01)
  *H01L 21/60* (2006.01)
  *H01L 23/31* (2006.01)

(52) U.S. Cl.
  CPC ...... *H01L 21/4853* (2013.01); *H01L 21/4857* (2013.01); *H01L 23/3114* (2013.01); *H01L 24/13* (2013.01); *H01L 2021/60022* (2013.01); *H01L 2224/0391* (2013.01); *H01L 2224/0401* (2013.01); *H01L 2224/05571* (2013.01); *H01L 2224/05647* (2013.01); *H01L 2224/1134* (2013.01); *H01L 2224/1146* (2013.01); *H01L 2224/1148* (2013.01); *H01L 2224/11332* (2013.01); *H01L 2224/11334* (2013.01); *H01L 2224/11849* (2013.01); *H01L 2224/131* (2013.01); *H01L 2224/13023* (2013.01); *H01L 2224/48227* (2013.01); *H01L 2224/48247* (2013.01); *H01L 2224/73265* (2013.01); *H01L 2224/94* (2013.01); *H01L 2924/00* (2013.01); *H01L 2924/0002* (2013.01); *H01L 2924/00014* (2013.01)

(56) References Cited

U.S. PATENT DOCUMENTS

| | | | | |
|---|---|---|---|---|
| 6,228,681 B1 * | 5/2001 | Gilleo | ............ | H01L 21/563 228/180.21 |
| 6,262,579 B1 * | 7/2001 | Chazan et al. | ............ | 324/537 |
| 6,271,107 B1 * | 8/2001 | Massingill et al. | ............ | 438/597 |
| 6,524,943 B1 * | 2/2003 | Sakuyama | ............ | 438/613 |
| 6,821,878 B2 * | 11/2004 | Danvir | ............ | H01L 21/563 257/E21.503 |
| 7,279,720 B2 * | 10/2007 | Fang | ............ | H01L 24/11 257/98 |
| 7,514,291 B2 * | 4/2009 | Akram | ............ | 438/110 |
| 7,629,250 B2 * | 12/2009 | Benson et al. | ............ | 438/637 |
| 7,767,586 B2 * | 8/2010 | Verhaverbeke | ............ | H01L 24/11 134/2 |
| 8,969,134 B2 * | 3/2015 | Brun | ............ | H01L 24/11 257/E21.006 |
| 8,975,177 B2 * | 3/2015 | Sasagawa | ............ | B23K 26/362 257/737 |
| 2001/0017414 A1 * | 8/2001 | Gilleo | ............ | H01L 21/563 257/737 |
| 2002/0170897 A1 * | 11/2002 | Hall | ............ | 219/121.73 |
| 2003/0214795 A1 * | 11/2003 | Sakuyama | ............ | H01L 24/11 361/767 |
| 2004/0169275 A1 * | 9/2004 | Danvir | ............ | H01L 21/563 257/737 |
| 2006/0211171 A1 * | 9/2006 | Tummala | ............ | H01L 21/563 438/108 |
| 2010/0109160 A1 * | 5/2010 | Sakaguchi et al. | ............ | 257/737 |
| 2011/0056738 A1 * | 3/2011 | Hu | ............ | 174/261 |
| 2012/0326296 A1 * | 12/2012 | Choi et al. | ............ | 257/737 |
| 2014/0273431 A1 * | 9/2014 | Sasagawa | ............ | B23K 26/362 438/618 |
| 2014/0335686 A1 * | 11/2014 | Brun | ............ | H01L 24/11 438/614 |
| 2015/0072479 A1 * | 3/2015 | Dias | ............ | H01L 21/56 438/127 |
| 2015/0072515 A1 * | 3/2015 | Dias | ............ | H01L 24/11 438/613 |
| 2016/0056119 A1 * | 2/2016 | Hong | ............ | H01L 24/17 257/737 |
| 2017/0098588 A1 * | 4/2017 | Yang | ............ | H01L 23/3114 |

\* cited by examiner

US 9,786,517 B2

ABLATION METHOD AND RECIPE FOR WAFER LEVEL UNDERFILL MATERIAL PATTERNING AND REMOVAL

FIELD

Integrated circuit packaging.

BACKGROUND

One method of connecting a semiconductor die to a substrate such as a package substrate is through a soldered connection between a contact pad of the die and a contact pad of the substrate (e.g., a package substrate). An underfill material of, for example, an epoxy resin may be disposed around the soldered connection to improve, among other things, temperature cycling capability. One technique for introducing an underfill material is to introduce it to the die at the wafer level (i.e., before dicing of the wafer into individual dice). A typical process includes applying an underfill material as a blanket over a wafer surface including over contacts. The underfill material is then baked/cured and then planarized to a plane of the contact pads to expose the contact pads. A photoresist is then introduced and patterned leaving the contact pads exposed. This is followed by the application of a soldered paste to the contact pads and reflow to establish the solder connection to the individual contact pads. The photoresist material is then removed leaving the solder on the contact pads and the underfill material surrounding the contact pads.

To expose the contact pads through underfill material, current methods involve grinding, chemical mechanical polish or fly cut techniques. These methods produce residues that can embed in the underfill material between pads and potentially damaged fragile dielectric materials on the die. In addition, the current techniques to remove photoresist material from the wafer after solder reflow use wet (aqueous or organic) strippers. These strippers have a tendency to etch the backside of the wafer, solder and other film material. Photoresist materials are difficult to remove using conventional strippers because they generally have a high density of cross-linking to withstand a solder reflow temperature (e.g., 260° C.) and be compatible with a solder paste material and other processing materials. The more cured the photoresist material, the more cross-linking and the more difficult it is to remove without damaging other materials on the wafer. The temperature associated with solder reflow often contributes to the curing of the photoresist material.

DETAILED DESCRIPTION

A method is described directed at introducing an underfill material over contact pads on a surface of an integrated circuit substrate such as a wafer and removing underfill material as desired using temporally coherent electromagnetic radiation such as provided by a pulsed-wave ultraviolet laser or a constant wave excimer projection laser. In one embodiment, a laser ablation method is described that selectively removes underfill material to expose contact pads on a wafer and/or to remove underfill material between and around contact pads above the plane of the contact pads to, for example, a level of a thickness of the contact pad (also referred to as planarizing the underfill material to a plane of a superior surface of the contact pad).

Figure 1:
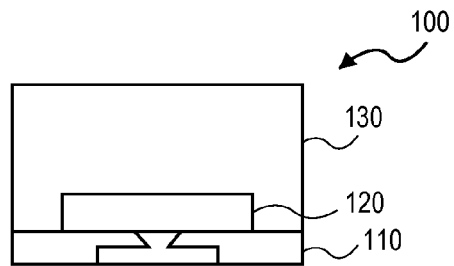
FIG. 1 shows a side view of a portion of a wafer including a contact pad on a surface and an underfill material on the surface and over the contact pad.

FIGS. 1-5 describe an embodiment of a process of introducing an underfill material on a wafer and using a laser ablation method to expose contact pads and planarize the underfill material after solder reflow. FIG. 1 shows structure 100 that is, for example, a side view of a portion of a wafer. Wafer 110 is, for example, a silicon wafer with many integrated circuit dice formed therein. Each die has a number of contact pads on a surface to connect the die to, for example, a substrate package after dicing. FIG. 1 shows contact pad 120 on a surface of wafer 110. Contact pad 120 is, for example, a copper pad. Overlying contact pad 120 as a blanket over, for example, a surface of wafer 110 is underfill material 130. Underfill material 130 is, for example, an epoxy material. Representative epoxy material includes an amine epoxy, imidizole epoxy, a phenolic epoxy or an anhydride epoxy. Other examples of underfill material include polyimide, benzocyclobutene (BCB), a bismalleimide type underfill, a polybenzoxazine (PBO) underfill, or a polynorborene underfill. Additionally, the underfill material 130 may include a filler material such as silica. Underfill material 130 may be introduced by spin coating, extrusion coating or spray coating techniques. In another embodiment, underfill material 130 is a standard fabrication passivation material such as an inorganic passivation material (e.g., silicon nitride, silicon oxynitride) or organic passivation material (e.g., polyimide).

Following the introduction of underfill material 130 on wafer 110, the underfill material is cured. One technique for curing an epoxy-based material is by heating structure 100.

Figure 2:
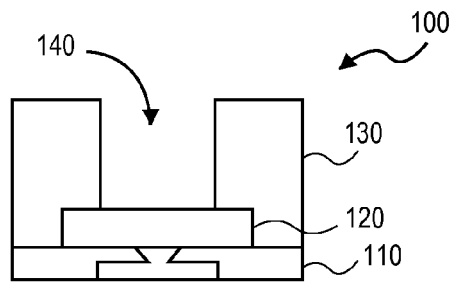
FIG. 2 shows the structure of FIG. 1 following ablating of the underfill material to expose the contact pad.

FIG. 2 shows the structure of FIG. 1 following the removal of underfill material to expose contact pad 120. In this embodiment, the removal defines an opening in the underfill material to a surface of contact pad 120 so that the remaining underfill material disposed in an area over contact pad 120 can act as a mold or frame into which a subsequent solder material may be introduced. In one embodiment, underfill material 130 is removed by ablating using temporally coherent electromagnetic radiation such as an ultraviolet or excimer laser. Representatively, in one embodiment, underfill material 130 is ablated using a pulsed-wave ultraviolet (UV) laser or constant wave excimer laser. Laser fluence power, spot size, pulse duration and repetition rate may be tailored for a specific underfill material and thickness that needs to be removed.

Figure 6:
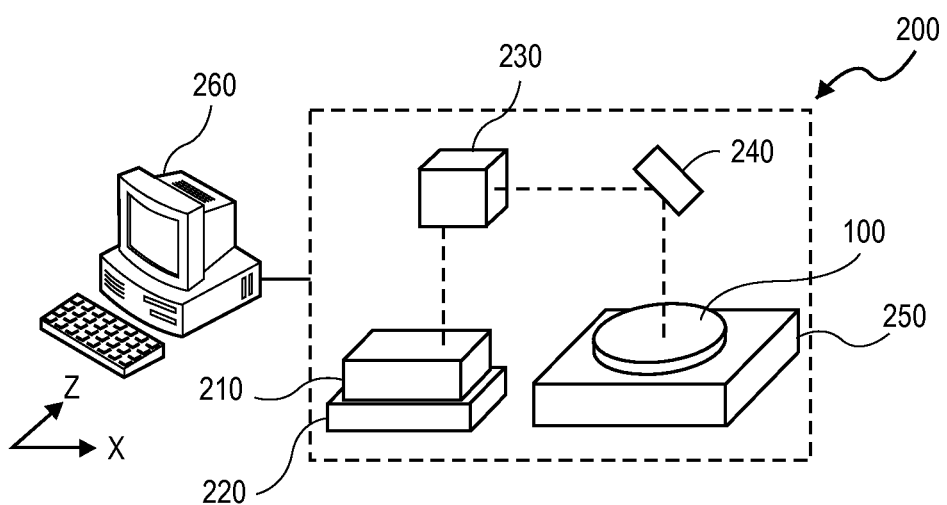
FIG. 6 shows a perspective top, side view of a laser ablation system including a pulsed-wave ultraviolet laser.

A pulsed-wave UV laser ablation technique, in one embodiment, uses a raster-based system that sequentially ablates underfill material selectively on top of contact pad (e.g., contact pad 120). One way this is done is by importing a Drawing eXchange Format (DXF) file of a pad pattern for a specific wafer into a laser milling tool and using a galvo system to direct a laser only to the contact pad area region prior to exposing the underfill material to the electromagnetic radiation (laser beam). FIG. 6 shows a schematic perspective top, side view of a system for conducting the laser ablation. Referring to FIG. 6, system 200 includes pulsed-wave UV laser 210 connected to servomechanism 220 that controls a mechanical position in at least an XZ direction of laser 210. Laser 210 directs electromagnetic radiation in the form of a beam to galvanometer 230 that steers the beam toward stage 250. Mirror 240 may be disposed between galvanometer 230 and stage 250 to, for example, collimate the radiation. A DXF file of a pad pattern for structure 100 is transferred from computer 260 to system 200 and non-transitory machine readable instructions stored in computer 260 may be executed to direct a laser ablation process of structure 100 on stage 250 of the system.

Referring again to FIG. 2, for a pulsed-wave UV laser ablation, a radiation recipe energy level is selected to ablate the underfill material 130. The underfill material is then exposed to the electromagnetic radiation to ablate the material over an area of the contact pad (contact pad 120). To ablate an area over a contact pad (contact pad 120) to expose a surface of the contact pad may take several passes depending on a thickness of the underfill material (underfill material 130). Once an area of the contact pad is exposed, the contact pad may be cleaned by a subsequent exposure(s) to temporally coherent electromagnetic radiation, such as the pulsed-wave UV laser using the same technique. In one embodiment, an ablation recipe includes an energy level that is lower than UV laser damage threshold energies for a material of contact pad 120 (e.g., copper).

Figure 7:
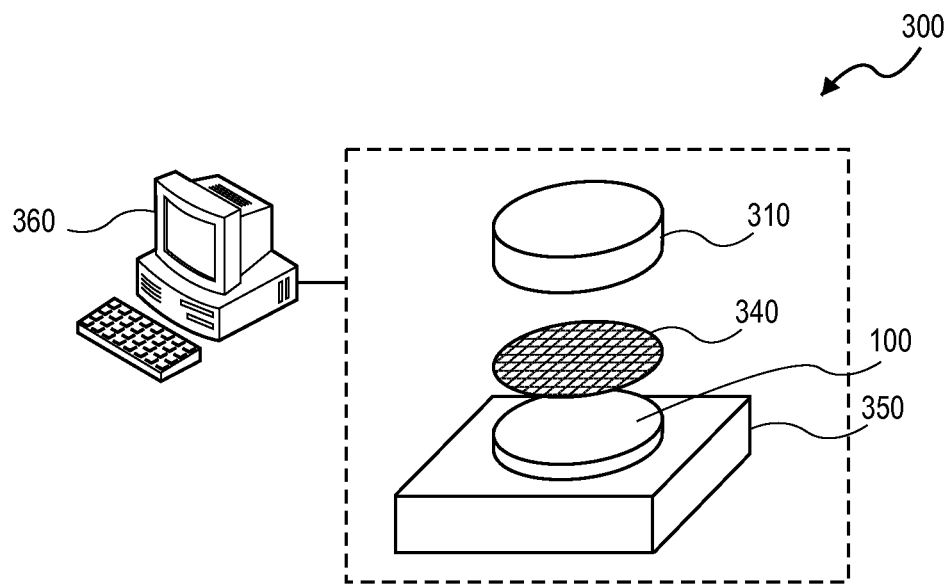
FIG. 7 shows a perspective top, side view of a laser ablation system including a constant wave excimer projection ultraviolet laser.

A constant wave excimer laser system is a projection-based system where large areas of underfill material can be ablated sequentially until a contact pad is exposed. One way this may be utilized to expose contact pads through an underfill material, such as contact pad 120, is by using a photomask of a wafer contact pad pattern between the beam and the underfill material (e.g., underfill material 130) to protect the underfill material around the pads from ablation and expose only areas of underfill material over contact pads (e.g., contact pad 130) to the electromagnetic radiation. FIG. 7 shows a schematic perspective top side view of a system employing a constant wave excimer laser. Referring to FIG. 7, system 300 includes laser 310 with an output disposed above structure 100 (e.g., wafer) on stage 350. Disposed between laser 310 and structure 100 is photomask 340. Photomask 340, in one embodiment, includes a contact pad pattern to protect the underfill material around the pads from ablation and expose areas of underfill material over contact pads. The ablation of the underfill material by way of a constant wave excimer laser may be directed by computer 360 that contains non-transitory executable machine-readable instructions to direct laser 310.

Referring again to FIG. 2, for a constant wave excimer process, the ablating exposure may be in the form of one or more pulses depending on a thickness of the underfill material (underfill material 130). Once an area of the contact pads is exposed, the contact pads may be cleaned by a subsequent exposure(s) to the excimer laser using the same technique. The subsequent exposure(s), in one embodiment, utilizes an ablation recipe that includes an energy level that is lower than excimer laser damage threshold energies for a material of contact pad 120. In another embodiment, both the initial ablating exposure(s) recipe and the subsequent cleaning exposure(s) include an energy level that is lower than excimer laser damage threshold energies for a material of the contact pad.

A laser or photoablation process allows selective removal of polymeric materials through photochemical versus thermal ablation. An advantage of a photoablation process is depth control in the organic material and clean removal of the organic material. The "cold" photoablation process would require assist of photon energy in with UV spectrum, with photon energy above hydro-carbon bond breakage. From the literature, C-C bond breakage requires a photon energy of 3.6 electron-volts (eV) which suits UV 355 nm laser radiation (third harmonic of YAG laser), and for C—H bond 4.3 eV which suits deep UV 266 nm laser radiation (fourth harmonic of YAG laser). The "hot" or "thermal" ablation process required excitation of vibrational energy modes in lattice of hydro-carbonic molecule, where IR-UV lasers are all suited. An advantage of deep UV lasers is obvious since ablation will promote clean and residue-free ablation of hydro-carbonic material by means of all ablation mechanisms.

A pulsed-wave UV laser ablation recipe for removal of underfill material of an amine epoxy on copper contact pads is show in Table 1:

TABLE 1

Laser wavelength: 355 nm
Power: 5.4 to 5.5 mJ
Frequency (rep rate): 47.5 KHz
Galvo speed: 150 mm/s
Spot Size: 8 microns
Beam expansion: 10X (beam diameter ~40 μm)
A DXF file of the contact pad pattern is imported to the system and galvo directs the laser beam to ablate only the copper contact pad regions
Number of passes depends on the thickness of underfill material over the copper contact pads that need to be remove A pulsed-wave UV laser ablation recipe for cleaning copper contact pads is shown in Table 2:

TABLE 2

Laser wavelength: 355 nm
Power: 18 mJ
Frequency (rep rate): 32 KHz
Galvo speed: 210 mm/s
Spot size: 8 microns
Beam expansion: 10X (beam diameter ~40 μm
A DXF file of the contact pad pattern is imported to the system and galvo directs the laser beam to ablate only the copper contact pad regions FIG. 2 shows underfill material 130 on wafer 110 with an opening to contact pad formed by laser ablating underfill material 130 at the opening 140.

Figure 3:
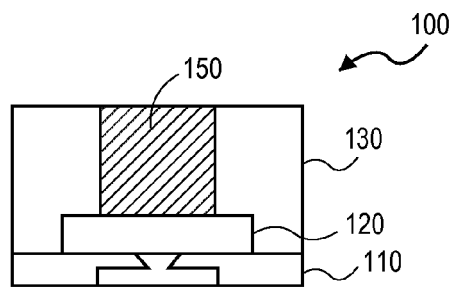
FIG. 3 shows the structure of FIG. 2 following the introduction of solder material onto the contact pad.
Figure 4:
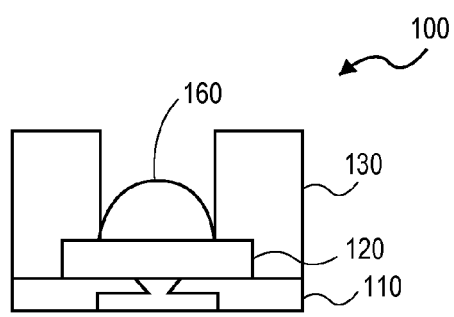
FIG. 4 shows the structure of FIG. 3 following heating of structure (solder reflow) to form a solder bump on the contact pad.

Once the contact pads, such as contact pad 120, are exposed, a solder material may be introduced. Solder materials could include but are not limited to solder paste material, solder balls or plated solder. FIG. 3 shows the structure of FIG. 2 following the introduction of solder material 150 onto contact pad 120. FIG. 4 shows the structure of FIG. 3 following heating of structure 100 (solder reflow) to form a solder ball 160 on contact pad 120.

Figure 5:
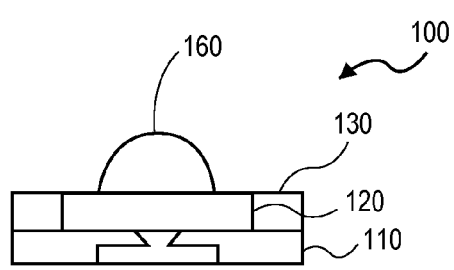
FIG. 5 shows the structure of FIG. 4 following the removal of the underfill material down to a plane of the contact pad.

FIG. 5 shows the structure of FIG. 4 following the removal of underfill material 130 down to a plane of contact pad 120 or to a desired point above a plane of contact point 120. In this manner, underfill material 130 surrounds the sides of contact pad 120. Representatively, removal or ablation of underfill material is done using temporally coherent electromagnetic radiation. In one embodiment, the temporally coherent electromagnetic radiation is in the form of a pulsed-wave UV or constant wave excimer laser. For a pulsed-wave UV laser ablation, a DXF file of the contact pad/bump pattern is imported into a galvo that directs the laser beam to ablate only underfill material outside the solder bump areas. For a constant wave excimer projection laser, a photo mask of the contact pad/bump pattern is placed between the projection laser and the wafer to expose only areas outside the solder bump areas to protect the solder bumps from getting damaged or contaminated.

A pulsed-wave UV laser ablation recipe for planarization of underfill material to the contact pad surface is shown in Table 3:

TABLE 3

Figure 8:
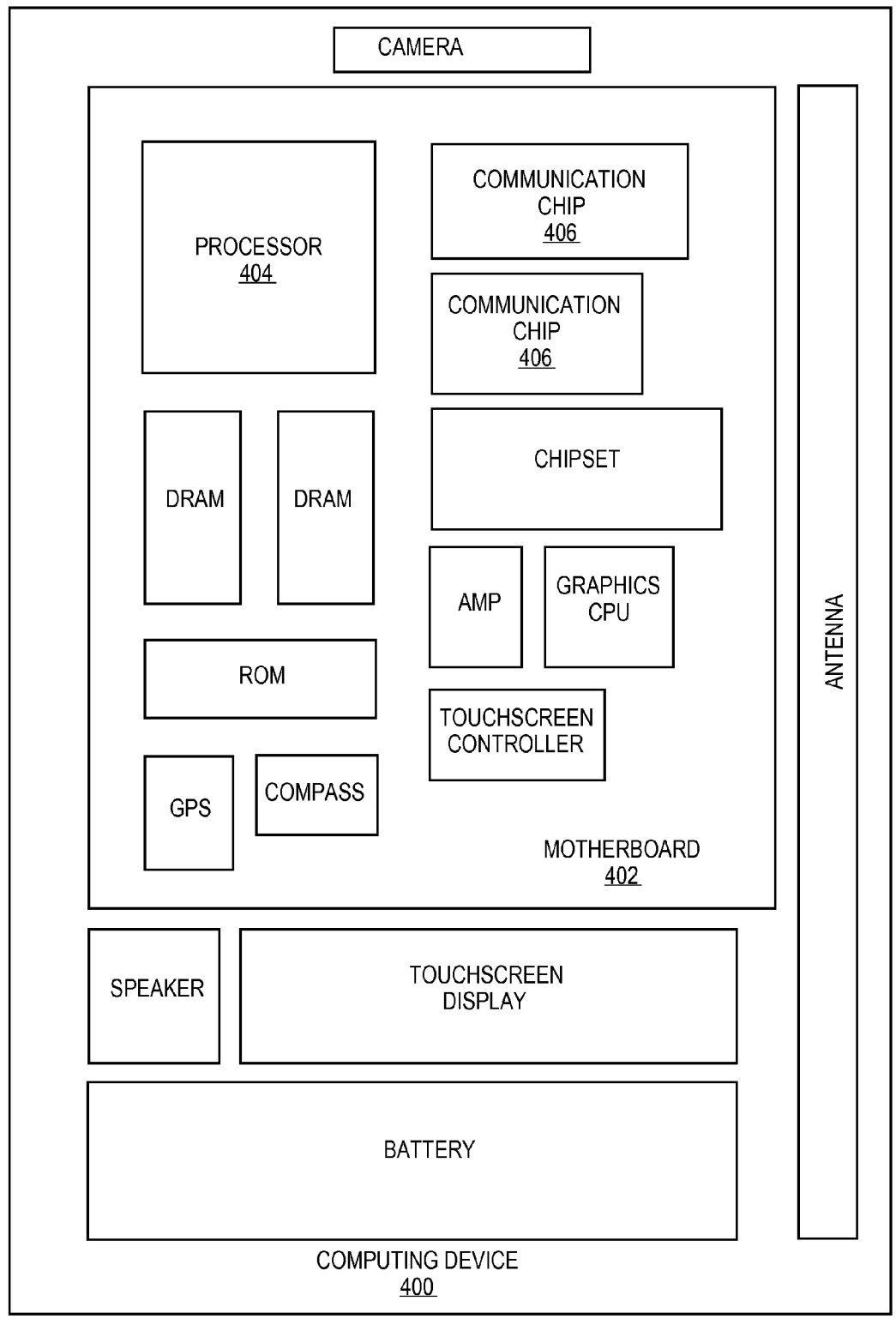
FIG. 8 illustrates a schematic illustration of a computing device.

Laser wavelength: 355 nm
Power: 29 A @ .904 watts
Frequency (rep rate): 15 kHz
Galvo speed: 100 mm/s
Spot size: 8 microns
Beam expansion: 10X (beam diameter ~40 μm)
Number of passes depends on thickness of underfill material above the plane of the copper contact pad surfaces that need to be removed FIG. 8 illustrates a computing device 400 in accordance with one implementation. Computing device 400 houses board 402. Board 402 may include a number of components, including but not limited to processor 404 and at least one communication chip 406. Processor 404 is physically and electrically connected to board 402 through, for example, a package substrate. Processor 404 is a die including solder bumps on contact pads, formed as described above, to connect to the package substrate. In some implementations the at least one communication chip 406 is also physically and electrically coupled to board 402. In further implementations, communication chip 406 is part of processor 404.

Depending on its applications, computing device 400 may include other components that may or may not be physically and electrically coupled to board 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 406 enables wireless communications for the transfer of data to and from computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

In various implementations, computing device 400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 400 may be any other electronic device that processes data.

EXAMPLES

The following examples pertain to embodiments.

Example 1 is a method including introducing an underfill material over contact pads on a surface of an integrated circuit substrate; and ablating the introduced underfill material to expose an area of the contact pads using temporally coherent electromagnetic radiation.

In Example 2, the method of Example 1, further includes introducing a solder to the exposed area of the contact pads.

In Example 3, after ablating the underfill material to expose an area of the contact pads in the method of Example 1, the method includes exposing the contact pads to temporally coherent electromagnetic radiation.

In Example 4, ablating in the method of Example 1 includes defining an opening in the underfill material to the contact pads.

In Example 5, ablating the underfill material in the method of Example 1 includes a first ablating prior to introducing the solder, the first ablating defining an opening in the underfill material to the contact pads, and the method further includes, after introducing the solder, second ablating the underfill material to a thickness of the contact pads.

In Example 6, the temporally coherent electromagnetic radiation in the method of Example 1 is provided by a pulsed-wave ultraviolet laser.

In Example 7, the temporally coherent electromagnetic radiation in the method of Example 1 is provided by a constant wave excimer projection laser.

In Example 8, any of the methods of Examples 1-7 are used in the formation of an integrated circuit substrate, such as a microprocessor, including contact pads for connection to a package.

Example 9 is a method including introducing an underfill material over contact pads on a surface of an integrated circuit substrate; first ablating the underfill material to expose an area of the contact pads using temporally coherent electromagnetic radiation; introducing a solder to the exposed area of the contact pads; and after introducing the solder, second ablating the underfill material using temporally coherent electromagnetic radiation.

In Example 10, second ablating the underfill material in the method of Example 9 includes ablating the underfill material to a plane of the contact pads.

In Example 11, prior to introducing the solder in the method of Example 9, the method includes exposing the contact pads to temporally coherent electromagnetic radiation.

In Example 12, the temporally coherent electromagnetic radiation of the method of Example 9 is provided by a pulsed-wave ultraviolet laser.

In Example 13, the temporally coherent electromagnetic radiation of the method of Example 9 is provided by a constant wave excimer projection laser.

In Example 14, any of the methods of Examples 9-13 are used in the formation of a die such as microprocessor including contact pads for connection to a package.

Example 15 is a method including introducing an underfill material over contact pads on a surface of an integrated circuit substrate; defining an opening in the underfill material to expose an area of the contact pads using temporally coherent electromagnetic radiation; introducing a solder material to the exposed area of the contact pads; and after introducing the solder, removing the sacrificial material.

In Example 16, after introducing the solder material in the method of Example 15, includes ablating the underfill material to a thickness of the contact pads.

In Example 17, the temporally coherent electromagnetic radiation of the method of Example 15 is provided by a pulsed-wave ultraviolet laser.

In Example 18, the temporally coherent electromagnetic radiation of the method of Example 15 is provided by a constant wave excimer projection laser.

In Example 19, any of the methods of Examples 15-18 are used in the formation of an integrated circuit substrate, such as microprocessor, including contact pads for connection to a package.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known structures, devices, and operations have been shown in block diagram form or without detail in order to avoid obscuring the understanding of the description. Where considered appropriate, reference numerals or terminal portions of reference numerals have been repeated among the figures to indicate corresponding or analogous elements, which may optionally have similar characteristics.

It should also be appreciated that reference throughout this specification to "one embodiment", "an embodiment", "one or more embodiments", or "different embodiments", for example, means that a particular feature may be included in the practice of the invention. Similarly, it should be appreciated that in the description various features are sometimes grouped together in a single embodiment, figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

What is claimed is:

1. A method comprising:
   introducing an underfill material over contact pads on a surface of an integrated circuit substrate, wherein the underfill material is selected from an epoxy material, a benzocyclobutene, a bismalleimide-type underfill material, a polybenzoxazine and a polynorbene; and
   first ablating a portion of the underfill material to expose an area of the contact pads using temporally coherent electromagnetic radiation;
   introducing a solder to the exposed area of the contact pads; and
   after introducing the solder, second ablating a portion of the underfill material using temporally coherent electromagnetic radiation such that, following the second ablating, the underfill material on the surface of the integrated circuit substrate comprises a thickness of the contact pads,
   wherein the second ablating includes ablating the underfill material selected from an epoxy material, a benzocyclobutene, a bismalleimide-type underfill material, a polybenzoxazine and a polynorbene.

2. The method of claim 1, wherein after first ablating the underfill material to expose an area of the contact pads, exposing the contact pads to temporally coherent electromagnetic radiation.

3. The method of claim 1, wherein first ablating comprises defining an opening in the underfill material to the contact pads.

4. The method of claim 1, wherein the temporally coherent electromagnetic radiation is provided by a pulsed-wave ultraviolet laser.

5. The method of claim 1, wherein prior to first ablating the underfill material, the underfill material is cured.

6. A method comprising:
   introducing an underfill material over contact pads on a surface of an integrated circuit substrate, wherein the underfill material is selected from an epoxy material, a benzocyclobutene, a bismalleimide-type underfill material, a polybenzoxazine and a polynorbene;
   first ablating the underfill material to expose an area of the contact pads using temporally coherent electromagnetic radiation;
   introducing a solder to the exposed area of the contact pads; and
   after introducing the solder, reducing a thickness of the underfill material on the surface of the integrated circuit substrate from a first thickness to a second thickness by second ablating the underfill material using temporally coherent electromagnetic radiation,
   wherein the second ablating includes ablating the underfill material selected from an epoxy material, a benzocyclobutene, a bismalleimide-type underfill material, a polybenzoxazine and a polynorbene.

7. The method of claim 6, wherein second ablating the underfill material comprises ablating the underfill material to a plane of the contact pads.

8. The method of claim 6, wherein prior to introducing the solder, exposing the contact pads to temporally coherent electromagnetic radiation.

9. The method of claim 6, wherein the temporally coherent electromagnetic radiation is provided by a pulsed-wave ultraviolet laser.

10. The method of claim 7, wherein prior to first ablating the underfill material, curing the underfill material.

11. A method comprising:
introducing an underfill material over contact pads on a surface of an integrated circuit substrate, wherein the surface comprises a plurality of contact pads wherein introducing the underfill material comprises introducing the underfill material over the plurality of contact pads, wherein the underfill material is selected from an epoxy material, a benzocyclobutene, a bismalleimide-type underfill material, a polybenzoxazine and a polynorbene;
defining an opening in the underfill material to expose an area of the contact pads using temporally coherent electromagnetic radiation;
introducing a solder material to the exposed area of the contact pads; and
after introducing the solder material, reducing a thickness of the underfill material from a first thickness to a second thickness,
wherein reducing the thickness of the underfill material includes reducing a thickness of the underfill material selected from an epoxy material, a benzocyclobutene, a bismalleimide-type underfill material, a polybenzoxazine and a polynorbene.

12. The method of claim 11, wherein reducing a thickness of the underfill material comprises ablating the underfill material to a thickness of the contact pads.

13. The method of claim 11, wherein the temporally coherent electromagnetic radiation is provided by a pulsed-wave ultraviolet laser.

\* \* \* \* \*